US008717219B2

(12) United States Patent
Deguchi

(10) Patent No.: US 8,717,219 B2
(45) Date of Patent: May 6, 2014

(54) SEMICONDUCTOR INTEGRATED CIRCUIT AND IMAGE SENSOR

(71) Applicant: Kabushiki Kaisha Toshiba, Tokyo (JP)

(72) Inventor: Jun Deguchi, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/780,685

(22) Filed: Feb. 28, 2013

(65) Prior Publication Data
US 2014/0070975 A1 Mar. 13, 2014

(51) Int. Cl.
H03M 1/38 (2006.01)

(52) U.S. Cl.
USPC .......................................... 341/161; 341/162

(58) Field of Classification Search
USPC .................. 341/161, 162, 110, 172, 156, 155
See application file for complete search history.

(56) References Cited

U.S. PATENT DOCUMENTS 8,441,386 B2 * 5/2013 Strode ........................... 341/162

OTHER PUBLICATIONS

Chun-Cheng Liu, et al., "A 10-bit 50-MS/s SAR ADC With a Monotonic Capacitor Switching Procedure", IEEE Journal of Solid-State Circuits, vol. 45, No. 4, Apr. 2010, pp. 731-740.
Yan Zhu, et al., "A 10-bit 100-MS/s Reference-Free SAR ADC in 90 nm CMOS" IEEE Journal of Solid-State Circuits, vol. 45, No. 6, Jun. 2010, pp. 1111-1121.

* cited by examiner

Primary Examiner — Joseph Lauture
(74) Attorney, Agent, or Firm — Oblon, Spivak, McClelland, Maier & Neustadt, L.L.P.

(57) ABSTRACT

According to one embodiment, a semiconductor integrated circuit is configured to convert a difference between a first analog voltage and a second analog voltage into a digital signal. The semiconductor integrated circuit includes m (m is an integer greater than or equal to 2) first capacitors and second capacitors. Each of the m capacitors has a first electrode and a second electrode, and the first electrodes are connected to each other. Each of the m second capacitors has a third electrode and a fourth electrode, and the third electrodes are connected to each other. The semiconductor integrated circuits further includes: a comparator configured to compare a voltage of the first electrode and a voltage of the third electrode; and a logic circuit configured to generate the digital signal based on a comparison result of the comparator.

19 Claims, 14 Drawing Sheets

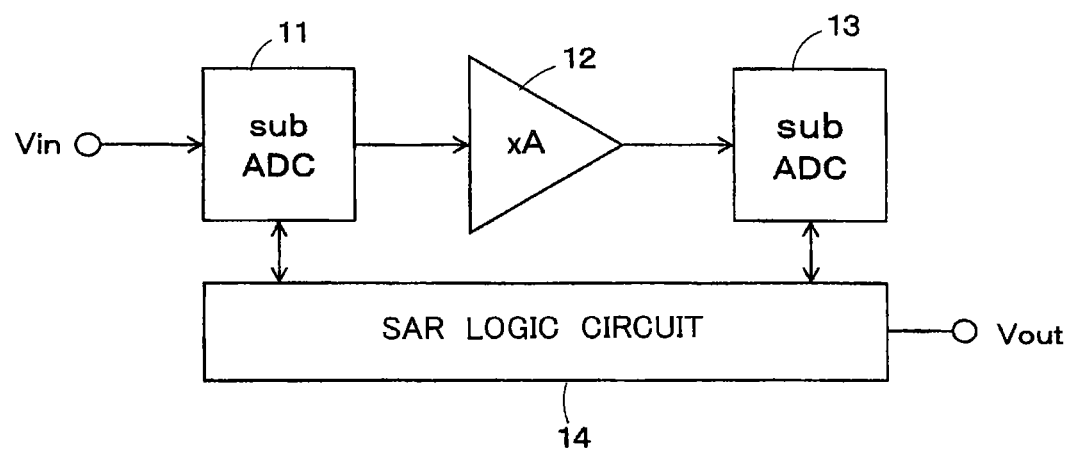
F I G. 1

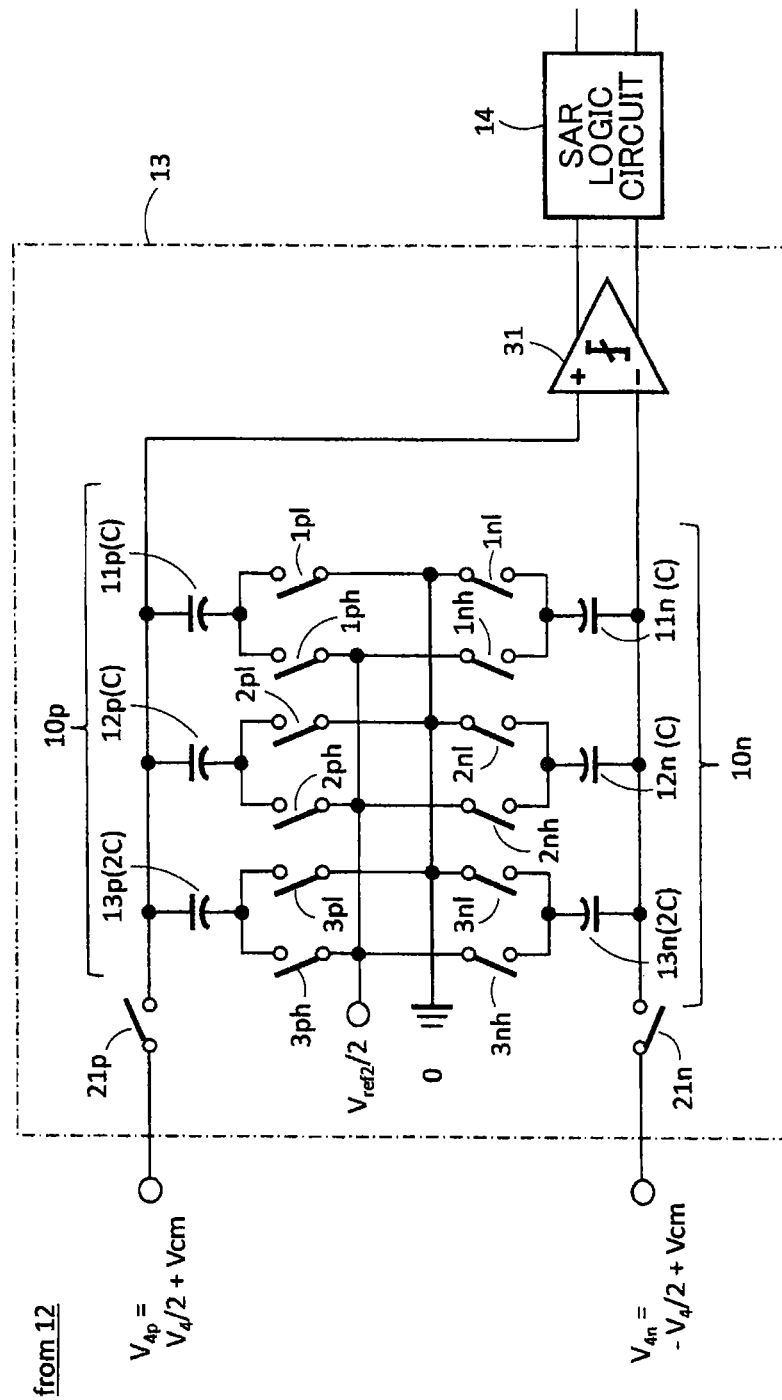
F I G. 4

F I G. 6    6th STAGE

FIG. 8    6th STAGE

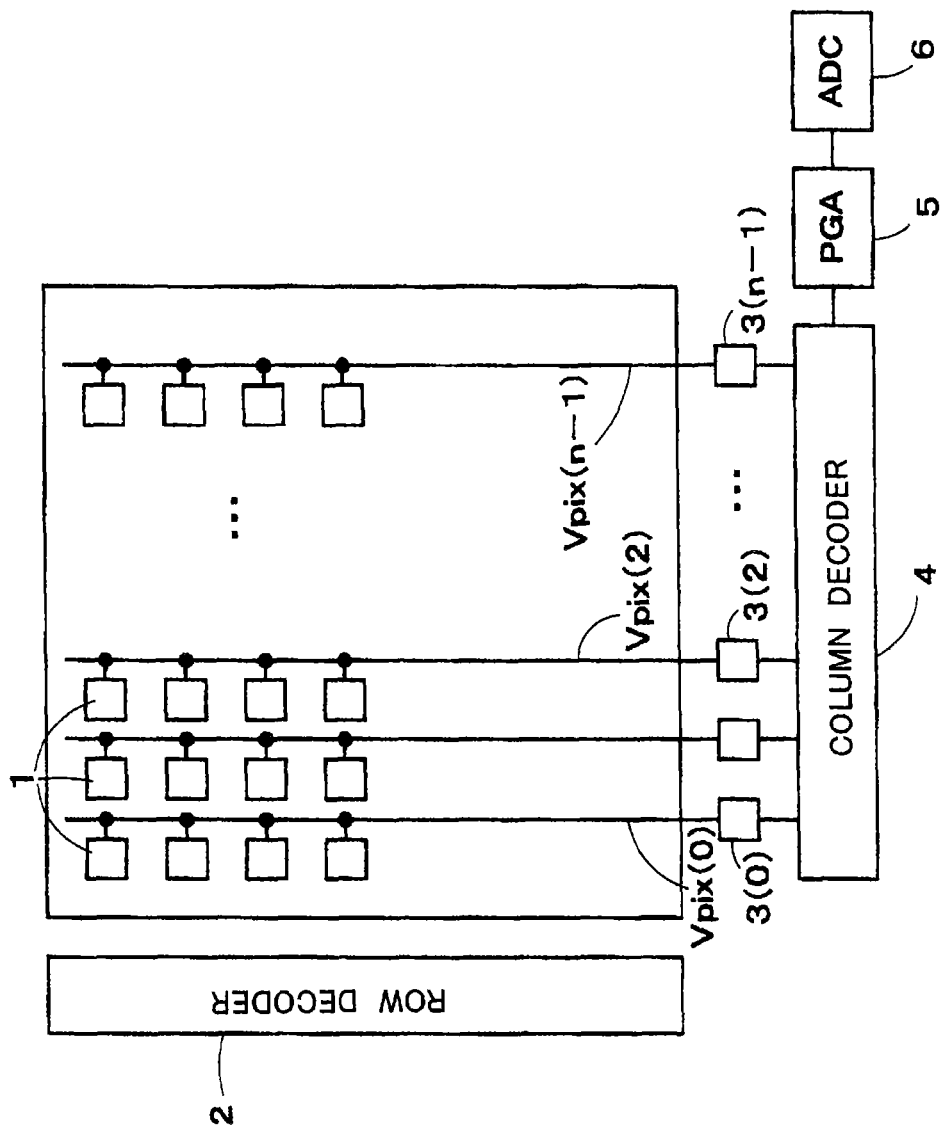
F I G. 9

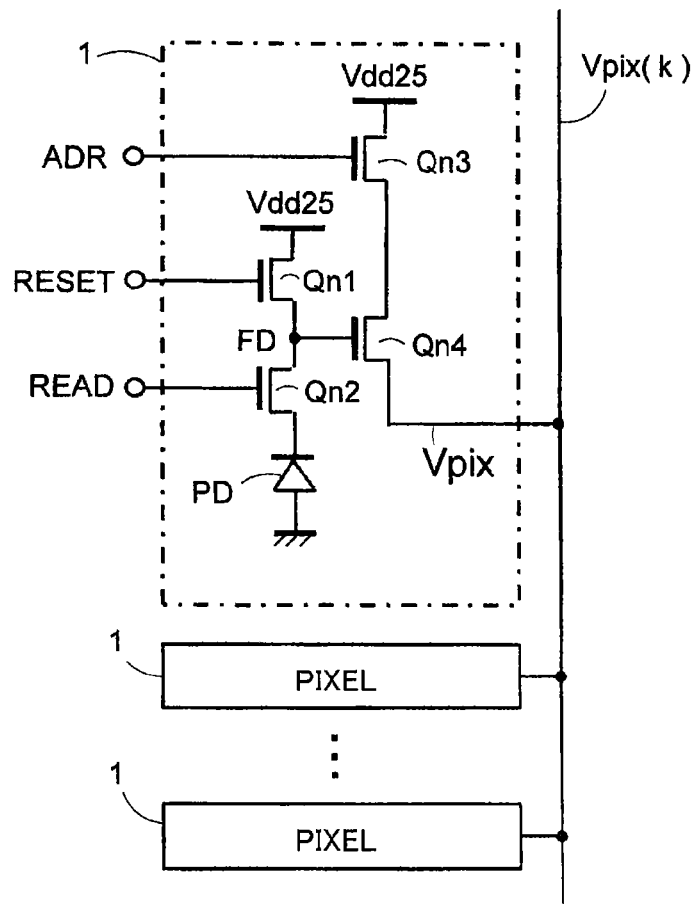
F I G. 10
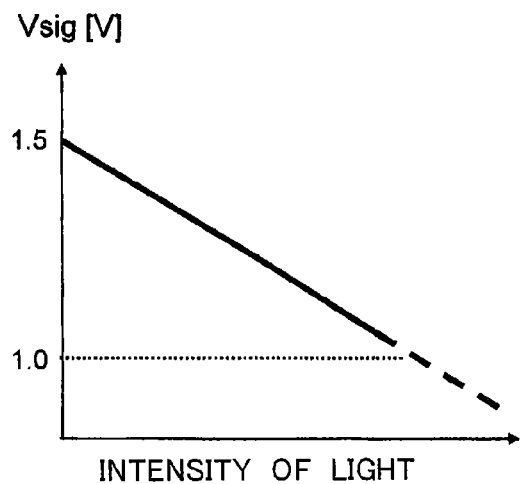
F I G. 11

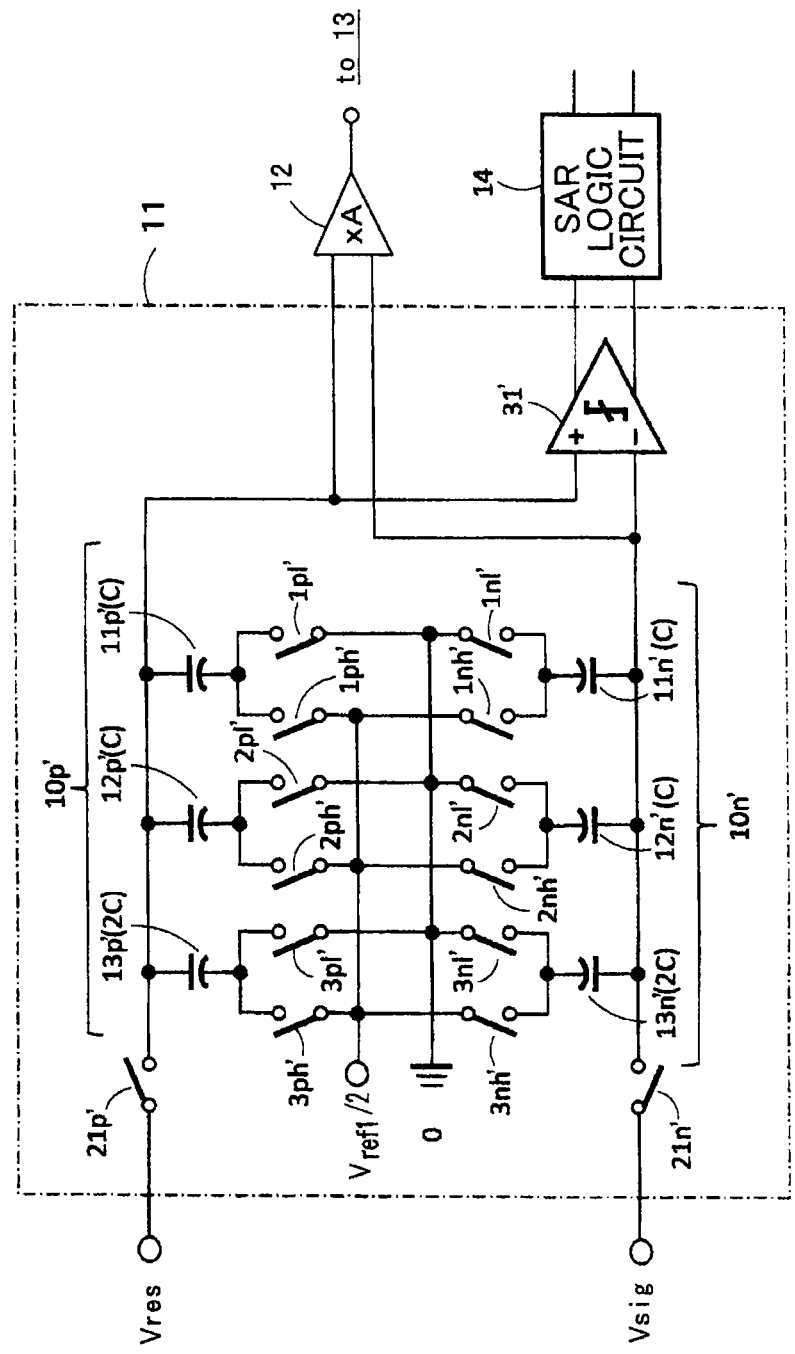
F I G. 12

| SETTING | 13p' | 12p' | 11p' | 13n' | 12n' | 11n' | Vofs |
|---|---|---|---|---|---|---|---|
| 0 | Vref1/2 | Vref1/2 | Vref1/2 | 0 | 0 | 0 | 0 |
| 1 | Vref1/2 | Vref1/2 | Vref1/2 | 0 | 0 | Vref1/2 | 1Vref1/8 |
| 2 | Vref1/2 | Vref1/2 | Vref1/2 | 0 | Vref1/2 | Vref1/2 | 2Vref1/8 |
| 3 | Vref1/2 | Vref1/2 | Vref1/2 | Vref1/2 | Vref1/2 | 0 | 3Vref1/8 |
| 4 | Vref1/2 | Vref1/2 | 0 | Vref1/2 | Vref1/2 | Vref1/2 | 4Vref1/8 |
| 5 | Vref1/2 | Vref1/2 | Vref1/2 | Vref1/2 | Vref1/2 | Vref1/2 | 5Vref1/8 |
| 6 | 0 | 0 | Vref1/2 | Vref1/2 | Vref1/2 | Vref1/2 | 6Vref1/8 |
| 7 | 0 | 0 | 0 | Vref1/2 | Vref1/2 | Vref1/2 | 7Vref1/8 |
| 8 | 0 | 0 | 0 | Vref1/2 | Vref1/2 | Vref1/2 | 8Vref1/8 |

FIG. 13

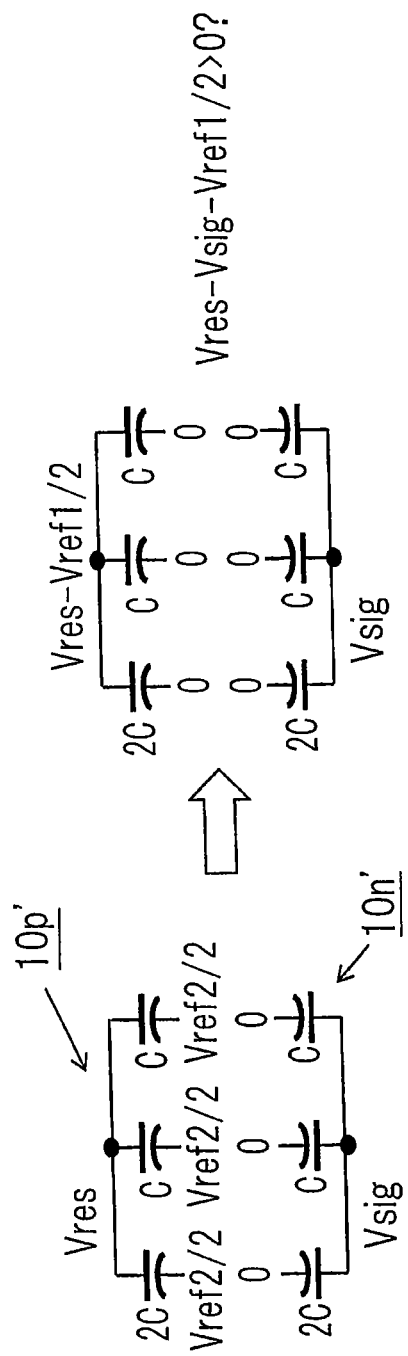
F I G. 14
SETTING 0

SEMICONDUCTOR INTEGRATED CIRCUIT AND IMAGE SENSOR

CROSS REFERENCE TO RELATED APPLICATIONS

This application is based upon and claims the benefit of priority from the prior Japanese Patent Application No. 2012-198743, filed on Sep. 10, 2012, the entire contents of which are incorporated herein by reference.

FIELD

Embodiments described herein relate generally to a semiconductor integrated circuit and an image sensor.

BACKGROUND

A voltage value read from an image sensor is converted into a digital signal by an A-D converter (Analog to Digital Converter, hereinafter also referred to as "ADC"). It is desired that the ADC is mounted as a circuit that is small as much as possible and the ADC operates consuming less power.

BRIEF DESCRIPTION OF THE DRAWINGS

FIG. 1 is a block diagram showing a schematic configuration of an ADC.

FIG. 4 is a circuit diagram showing an internal configuration of the sub-ADC 13.

FIG. 9 is a block diagram showing a schematic configuration of an image sensor.

FIG. 10 is a circuit diagram showing an example of an internal configuration of the pixel 1.

FIG. 11 is a diagram schematically showing a relationship between the intensity of the light emitted on the pixel 1 and the signal voltage Vsig generated by the pixel 1.

FIG. 12 is a circuit diagram showing an internal configuration of the sub-ADC 11.

FIG. 13 is a diagram showing a relationship between the voltages supplied to the bottom plates of the capacitors $10p'$ and $10n'$ in FIG. 12 and the offset voltage Vofs.

FIG. 14 is a diagram for explaining a case of setting 0.

DETAILED DESCRIPTION

In general, according to one embodiment, a semiconductor integrated circuit is configured to convert a difference between a first analog voltage and a second analog voltage into a digital signal. The semiconductor integrated circuit includes m (m is an integer greater than or equal to 2) first capacitors and second capacitors. Each of the m capacitors has a first electrode and a second electrode, and the first electrodes are connected to each other. Each of the m second capacitors has a third electrode and a fourth electrode, and the third electrodes are connected to each other. The semiconductor integrated circuits further includes: a comparator configured to compare a voltage of the first electrode and a voltage of the third electrode; and a logic circuit configured to generate the digital signal based on a comparison result of the comparator. The first analog voltage is inputted into the first electrode. The second analog voltage is inputted into the third electrode. One of a ground voltage and substantially ½ of a voltage of an input voltage range of the semiconductor integrated circuit is inputted into each second electrode and each fourth electrode.

Embodiments will now be explained with reference to the accompanying drawings.

First Embodiment

Hereinafter, embodiments will be specifically described with reference to the drawings.

FIG. 1 is a block diagram showing a schematic configuration of an ADC. The ADC converts an input analog voltage Vin into an output digital signal Vout by a pipeline scheme by using a successive approximation resistor (SAR). The ADC includes a sub-ADC 11, an amplifier 12, a sub-ADC 13, and a SAR logic circuit 14. At least a part of these can be implemented as a semiconductor integrated circuit.

Figure 2:
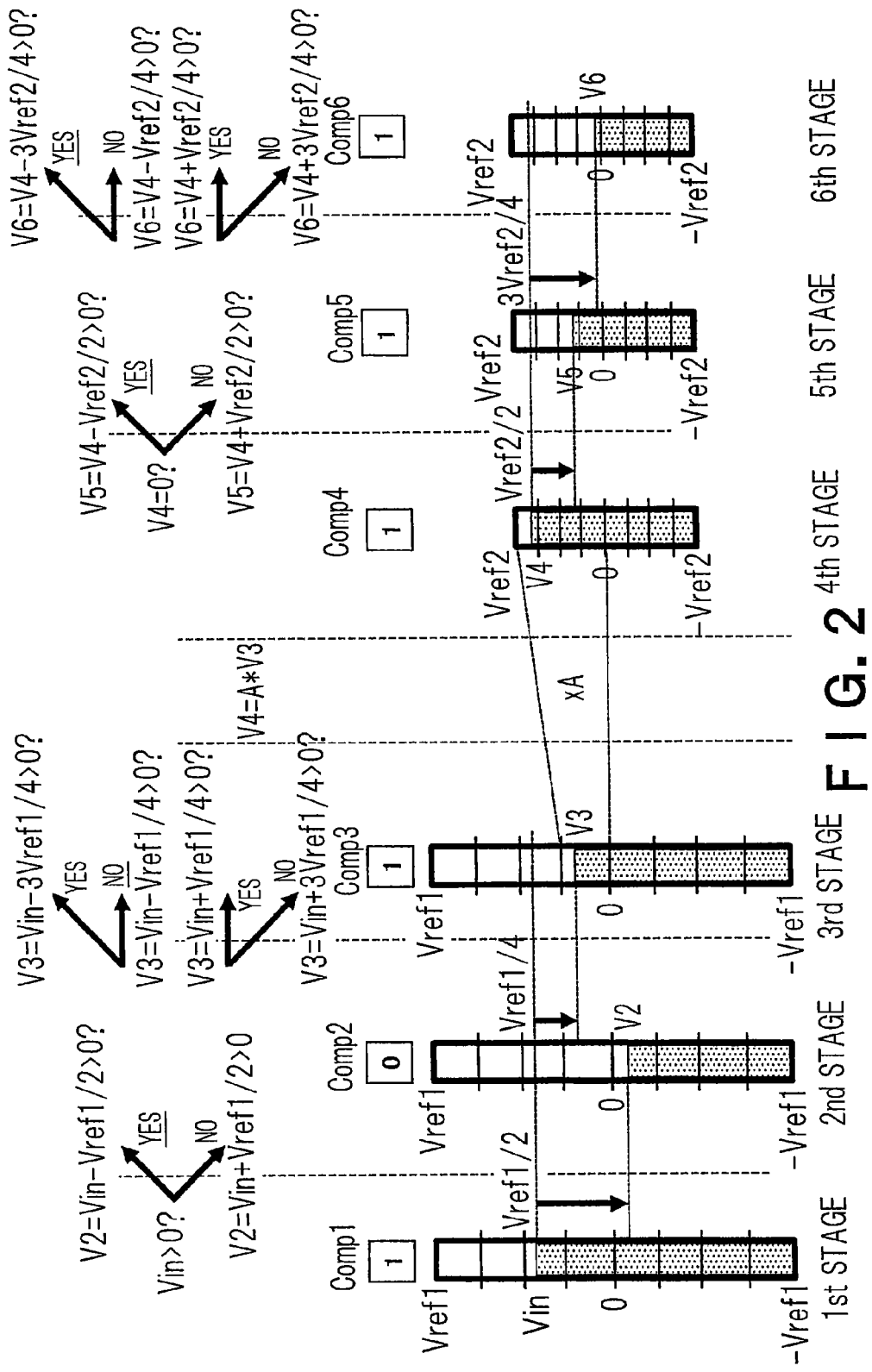
FIG. 2 is a diagram for explaining an example of an A-D conversion process by the ADC in FIG. 1.

FIG. 2 is a diagram for explaining an example of an A-D conversion process by the ADC in FIG. 1, which is a comparative example of an embodiment. FIG. 2 shows that each of the sub-ADCs 11 and 13 performs comparison three times and converts an analog input voltage Vin into a digital output signal Vout. The processes of a first stage to a third stage in FIG. 2 are performed by the sub-ADC 11 and the SAR logic circuit 14. The processes of a fourth stage to a sixth stage are performed by the sub-ADC 13 and the SAR logic circuit 14.

First, in the first stage, the sub-ADC 11 determines whether or not a condition 1: "Vin>1" is satisfied. When the condition 1 is satisfied, the SAR logic circuit 14 sets the most significant bit of the output digital signal Vout to "1" and generates a voltage $V_2$ represented by the following formula (1a).

$$V_2 = Vin - V_{ref1}/2 \quad (1a)$$

On the other hand, when the condition 1 is not satisfied, the SAR logic circuit 14 sets the most significant bit of the output digital signal Vout to "0" and generates a voltage $V_2$ represented by the following formula (1b).

$$V_2 = Vin + V_{ref1}/2 \quad (1b)$$

Here, the voltage $V_{ref1}$ is a maximum value of the analog voltage Vin.

Next, in the second stage, the sub-ADC 11 determines whether or not a condition 2: "$V_2>0$" is satisfied. When the condition 2 is satisfied, the SAR logic circuit 14 sets the second bit of the output digital signal Vout to "1" and generates a new voltage $V_3$. The voltage $V_3$ is represented by the formula (2a) below when the condition 1 is satisfied in the first stage and represented by the formula (2b) below when the condition 1 is not satisfied in the first stage.

$$V_3 = Vin - 3V_{ref1}/4 \quad (2a)$$

$$V_3 = Vin + V_{ref1}/4 \quad (2b)$$

On the other hand, when the condition 2 is not satisfied, the SAR logic circuit 14 sets the second bit of the output digital signal Vout to "0" and generates a new voltage $V_3$. The voltage $V_3$ is represented by the formula (2c) below when the condition 1 is satisfied in the first stage and represented by the formula (2d) below when the condition 1 is not satisfied in the first stage.

$$V_3 = Vin - V_{ref1}/4 \quad (2c)$$

$$V_3 = Vin + 3V_{ref1}/4 \quad (2d)$$

Subsequently, in the third stage, the sub-ADC 11 determines whether or not a condition 3: "$V_3>0$" Is satisfied, and the SAR logic circuit 14 sets the third bit of the output digital signal Vout according to the determination result.

When the above three determinations are completed, the amplifier 12 multiplies the voltage $V_3$, which is determined by the sub-ADC 11 at the third time, by gain "A" to generate a voltage A4 represented by the following formula (3), and then, the voltage A4 is inputted to the sub-ADC 13.

$$V_4 = A*V_3 \tag{3}$$

In an example shown in FIG. 2, the gain A of the amplifier 12 is set to a positive value so that the voltage $V_{ref1}/4$ becomes a maximum value $V_{ref2}$ of the sub-ADC 13 by the above formula (3). Subsequently, the sub-ADC 13 performs the same processes as those of the sub-ADC 11.

In the fourth stage, the sub-ADC 13 determines whether or not a condition 4: "$V_4>0$" is satisfied. The SAR logic circuit 14 generates a voltage $V_5$ represented by the formula (4a) below when the condition 4 is satisfied and generates a voltage $V_5$ represented by the formula (4b) below when the condition 4 is not satisfied.

$$V_5 = V_4 - V_{ref2}/2 \tag{4a}$$

$$V_5 = V_4 + V_{ref2}/2 \tag{4b}$$

However, regardless of whether or not the condition 4 is satisfied, the fourth bit of the output digital signal Vout is not set. The voltage $V_4$ is obtained by only multiplying the voltage $V_3$ by a constant gain. Therefore, the condition 4 is substantially equivalent to the condition 3, and thus, "whether or not the condition 4 is satisfied" accords with "whether or not the condition 3 is satisfied". As described above, the process of the fourth stage in FIG. 2 is not a process to determine the output digital signal Vout, so that the process is meaningless.

Subsequently, in the fifth stage, the fourth bit of the output digital signal Vout is set according to whether or not the condition 5: "$V_5>0$" is satisfied, and a voltage $V_6$ is generated. Further, in the sixth stage, the fifth bit of the output digital signal Vout is set according to whether or not the condition 6: "$V_6>0$" is satisfied.

In the manner as described above, the analog input voltage Vin is converted into a 5-bit output digital signal Vout.

According to the method described in FIG. 2, even though there are six stages, that is, three processes of the sub-ADC 11 and three processes of the sub-ADC 13, the output digital signal Vout of only 5-bit is obtained. This is because the process of the fourth stage is a meaningless process as described above.

Therefore, in the present embodiment, it is intended to obtain an output digital signal Vout, the number of bits of which is greater than that obtained by FIG. 2 by one bit, by the same amount of processes and the same circuit by performing an effective process in each stage.

Figure 3:
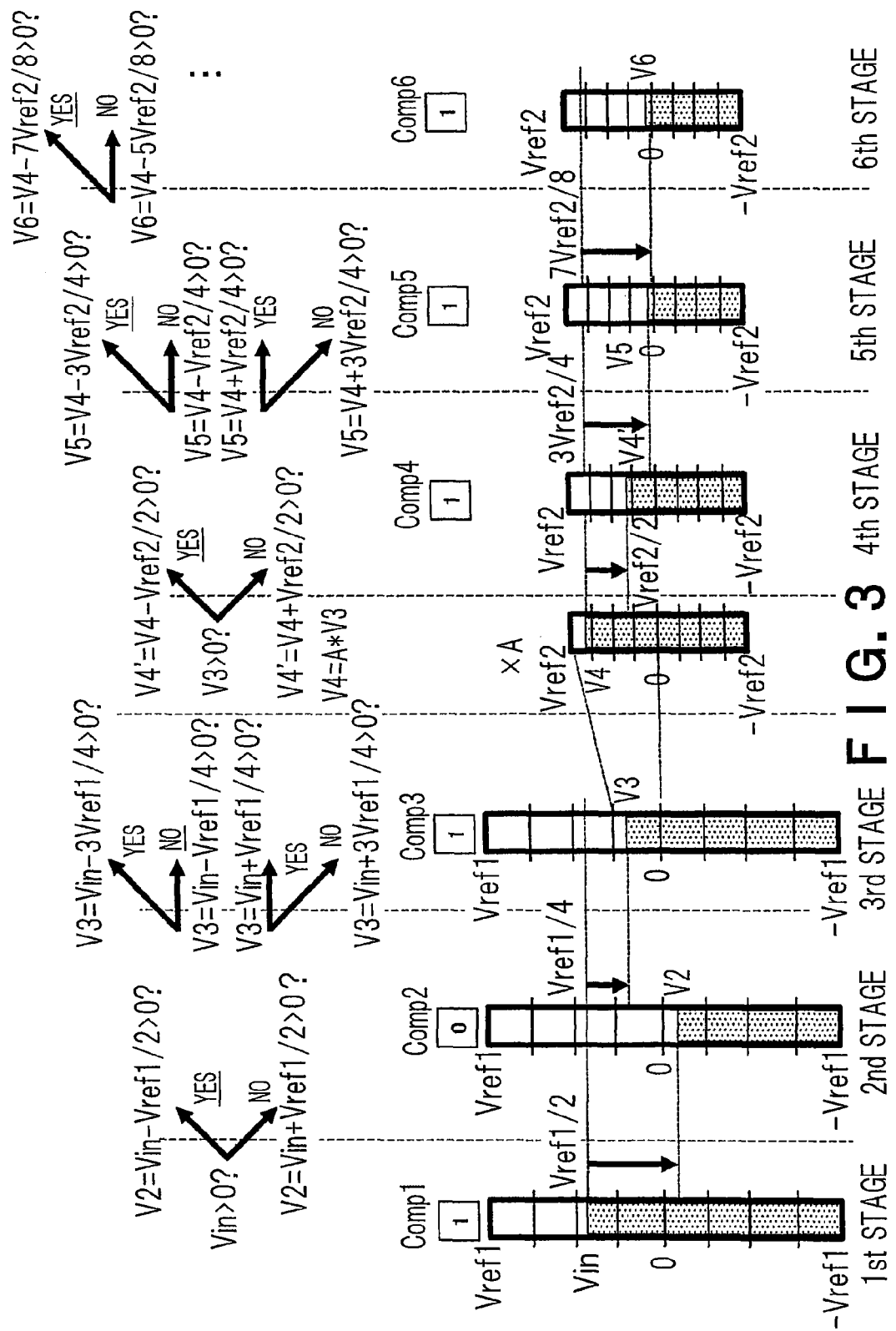
FIG. 3 is a diagram for explaining an A-D conversion process by the ADC in FIG. 1 according to the present embodiment.

FIG. 3 is a diagram for explaining an A-D conversion process by the ADC in FIG. 1 according to the present embodiment. Hereinafter, the difference from FIG. 2 will be mainly described. The processes of the sub-ADC 11 and the amplifier 12, that is, the processes of the first to the third stages, are the same as those in FIG. 2, and the most significant bit to the third significant bit of the output digital signal Vout are set and the voltage $V_4$ is generated.

The process of the fourth stage is significantly different from that of FIG. 2. The SAR logic circuit 14 generates a voltage $V_4'$ depending on whether or not the condition 3 is satisfied. When the condition 3 is satisfied, the voltage $V_4'$ is represented by the formula (5a) below, and when the condition 3 is not satisfied, the voltage $V_4'$ is represented by the formula (5b) below.

$$V_4' = V_4 - V_{ref2}/2 \tag{5a}$$

$$V_4' = V_4 + V_{ref2}/2 \tag{5b}$$

The sub-ADC 13 determines whether or not a condition 4': "$V_4'>0$" is satisfied.

The voltages $V_4'$ represented by the above formulas (5a) and (5b) are the same as the voltages $V_5$ shown in FIG. 2 and represented by the above formulas (4a) and (4b). Therefore, in the fourth stage in FIG. 3, the same determination as that in the fifth stage in FIG. 2 is performed. Accordingly, the fourth stage is an effective process and the fourth bit of the output digital signal Vout is set.

Thereafter, in the fifth stage and the sixth stage, the fifth bit and the sixth bit of the output digital signal Vout are set respectively, and a 6-bit output digital signal Vout is obtained. When comparing FIG. 2 and FIG. 3, although the total number of comparisons is the same, which is 6 times, FIG. 3 can increase the number of bits of the output digital signal Vout by one bit. This means that it is possible to reduce the area of the circuit for generating the output digital signal Vout, which has the same number of bits, to ½.

The number of bits can be increased by one bit compared with FIG. 2, the reason therefor is: in the fourth stage, instead of determining whether or not "$V_4>0$" is satisfied, the sub-ADC 13 determines whether or not "$V_4'>0$" is satisfied for the voltage $V_4'$ (=$V_5$ in FIG. 2) which is newly generated depending on whether or not the condition 3 is satisfied. Hereinafter, an example of a circuit for performing the processes as shown in FIG. 3 will be described.

FIG. 4 is a circuit diagram showing an internal configuration of the sub-ADC 13. In the present example, the amplifier 12 outputs the voltage $V_4$ in FIG. 3 as differential signals $V_4p$ and $V_4n$, and they are inputted into the sub-ADC 13. The sub-ADC 13 performs A-D conversion on the differential signals $V_4p$ and $V_4n$. Here, the relationship between the voltage $V_4$ and the differential signals $V_4p$ and $V_4n$ is represented by the following formulas (6a) and (6b).

$$V_4p = V_4/2 + Vcm \tag{6a}$$

$$V_4n = -V_4/2 + Vcm \tag{6b}$$

In other words, the difference between the differential signals $V_4p$ and $V_4n$ is the voltage $V_4$. Here, the Vcm is a common voltage of the sub-ADC 13. For example, the Vcm is ½ of the power supply voltage of the sub-ADC 13. The sub-ADC 13 converts the difference between the differential signal $V_4p$ (first analog voltage) and the differential signal $V_4n$ (second analog voltage) into a digital signal.

The sub-ADC 13 includes capacitors 11p to 13p and 11n to 13n, switches 1pl to 3pl, 1ph to 3ph, 1nl to 3nl, 1nh to 3nh, 21p, and 21n, and a comparator 31.

Top plates (first electrodes) of the capacitors 11p to 13p are connected to each other and also connected to the positive input terminal of the comparator 31. The differential signal $V_4p$ is inputted into the top plates through the switch 21p. A voltage $V_{ref2}/2$ can be supplied to a bottom plate (second electrode) of the capacitor 11p through the switch 1ph. Also a ground voltage can be supplied to the bottom plate of the capacitor 11p through the switch 1pl. The same applies on the capacitors 12p and 13p. Hereinafter, the capacitors 11p to 13p are also collectively referred to as "positive side capacitor" (first capacitor) 10p.

Top plates (third electrodes) of the capacitors 11n to 13n are connected to each other and also connected to the negative input terminal of the comparator 31. The differential signal $V_4$n is inputted into these top plates through the switch 21n. The voltage $V_{ref2}/2$ can be supplied to a bottom plate (fourth electrode) of the capacitor 11n through the switch 1nh. Also the ground voltage can be supplied to the bottom plate of the capacitor 11n through the switch 1nl. The same applies on the capacitors 12n and 13n. Hereinafter, the capacitors 11n to 13n are also collectively referred to as "negative side capacitor" (second capacitor) 10n.

The capacitances of the capacitors 11p, 12p, 11n, and 12p are the same, which is C. The capacitances of the capacitors 13p and 13n are double the above capacitance, that is, 2C.

The comparator 31 compares the voltage of the top plate of the positive side capacitor 10p and the voltage of the top plate of the negative side capacitor 10n. When the voltage of the top plate of the positive side capacitor 10p is greater than the voltage of the top plate of the negative side capacitor 10n, "1" is outputted to the SAR logic circuit 14 as a comparison result. When the voltage of the top plate of the negative side capacitor 10n is greater than the voltage of the top plate of the positive side capacitor 10p, "0" is outputted to the SAR logic circuit 14 as a comparison result.

Here, the voltage $V_{ref2}$ is, for example, an input voltage range of the sub-ADC 13. By supplying a voltage $V_{ref2}/2$, which is ½ of the input voltage range of the sub-ADC 13 instead of the input voltage range of the sub-ADC 13 itself, it is possible to reduce power consumption during switching. It is preferable that only two switches are connected to the bottom plate of each capacitor, and that one of two types of voltages (ground voltage or voltage $V_{ref2}/2$) is supplied to the bottom plate and other voltages are not supplied. Thereby, the circuit configuration can be simplified.

The sub-ADC 13 in FIG. 4 performs three comparisons and includes three capacitors on each of the positive and negative sides. Generally, when m comparisons are performed (m is an integer greater than or equal to 2), m capacitors 1ip to 1mp and m capacitors 11n to 1mn may be provided on the positive side and the negative side respectively. The capacitances of the capacitors 11p and 11n may be C and the capacitances of the capacitors 1kp and 1kn (k is an integer greater than or equal to 2 and smaller than or equal to m) may be $2^{(k-2)}C$.

The SAR logic circuit 14 of FIG. 4 sets each bit of the output digital signal Vout based on the comparison result of the comparator 31 and controls the switches 1pl to 3pl, 1ph to 3ph, 1nl to 3nl, 1nh to 3nh, 21p, and 21n.

When the SAR logic circuit 14 turns on the switches 21p and 21n, the differential voltages $V_4$p and $V_4$n are sampled by the top plates of the positive side capacitor 10p and the negative side capacitor 10n respectively, and electric charge according to each voltage is accumulated in the capacitor 10p and 10n. Subsequently, when the SAR logic circuit 14 turns off the switches 21p and 21n, the differential voltages $V_4$p and $V_4$n are held by the top plates of the positive side capacitor 10p and the negative side capacitor 10n, respectively. Hereinafter, such a processing operation is simply called "sample and hold of the differential voltages $V_4$p and $V_4$n".

Note that, although the sub-ADC 11 in FIG. 1 is not illustrated in the drawings and the description of the operation thereof is omitted, the sub-ADC 11 can perform the processes of the first to the third stages by a known circuit or the same circuit as that of the sub-ADC 13.

Figure 5:
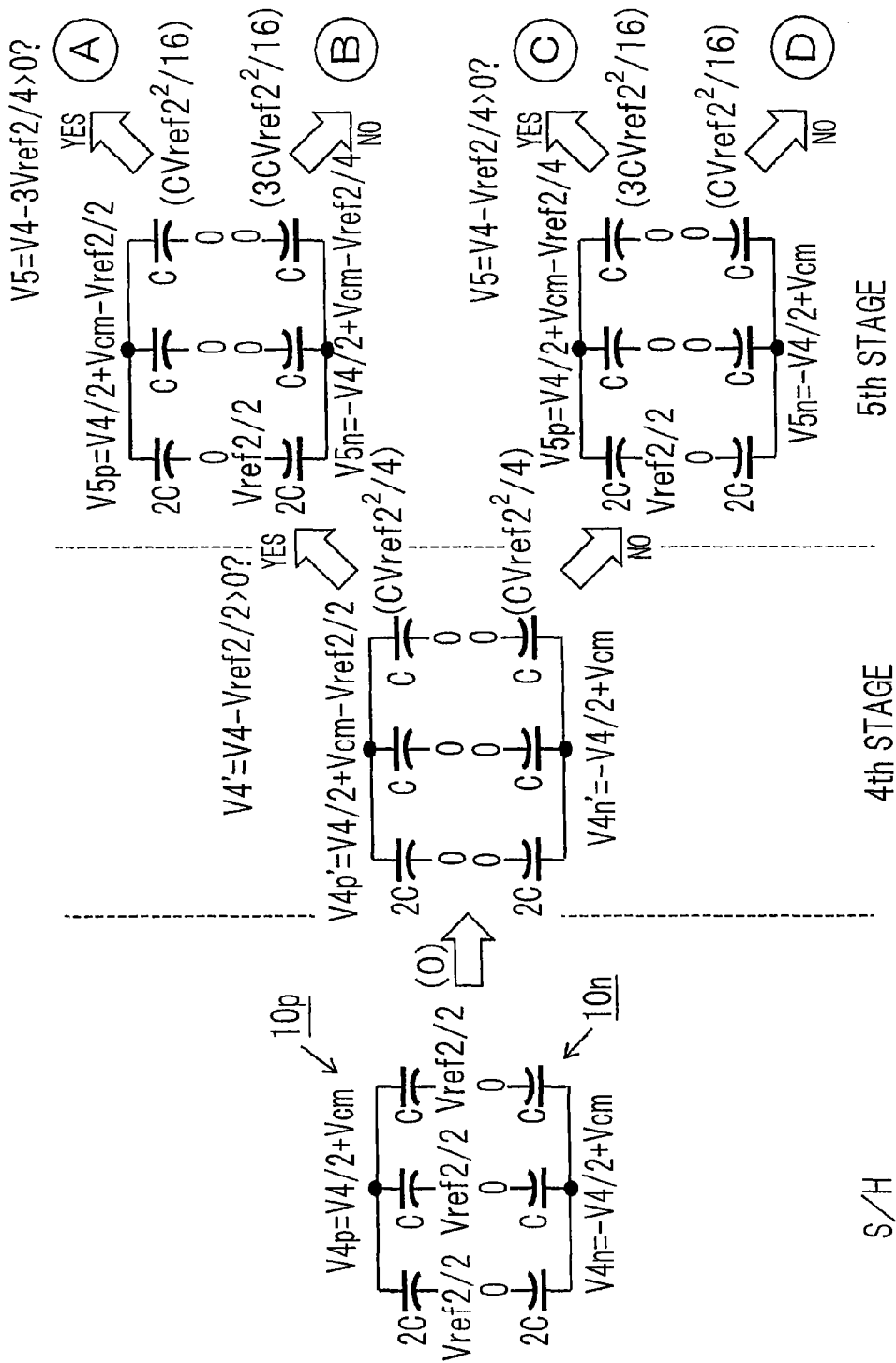
FIGS. 5 to 8 are diagrams for explaining the operation of the sub-ADC 13 and the SAR logic circuit 14 in FIG. 4.
Figure 6:
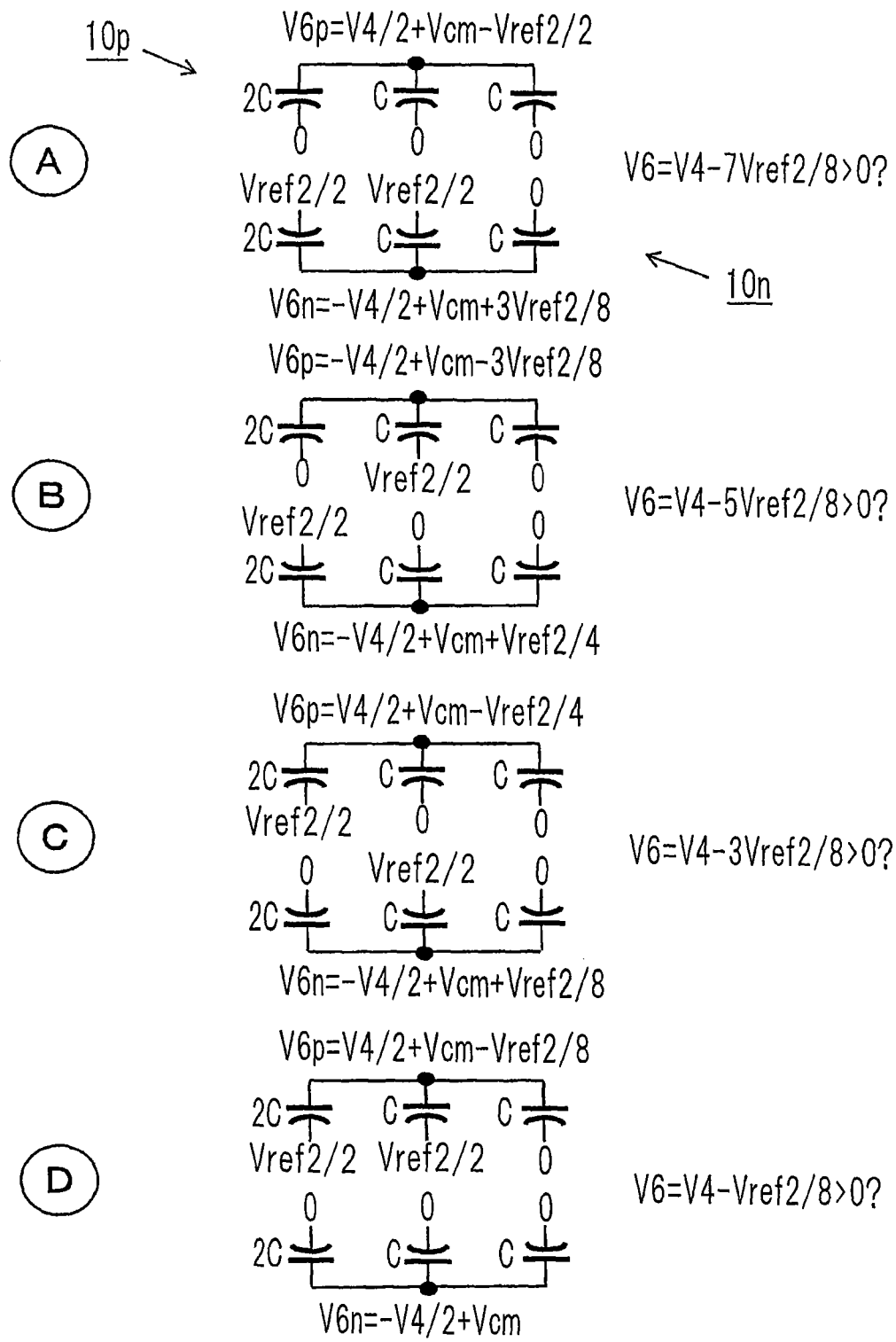

FIGS. 5 and 6 are diagrams for explaining the operation of the sub-ADC 13 and the SAR logic circuit 14 in FIG. 4, and show the operation when the condition 3: "$V_3$>0" is satisfied in the process of the third stage in FIG. 3. In FIGS. 5 and 6,
only the positive side capacitor 10p and the negative side capacitor 10n of the sub-ADC 13 are drawn in a simplified manner. As described above, since the voltage $V_4$ is obtained by multiplying the voltage $V_3$ by a constant number, "whether or not "$V_3$>0" is satisfied" can be translated into "whether or not "$V_4$>0" is satisfied", that is, "whether or not "$V_4$p>$V_4$n" is satisfied".

When $V_3$>0, the SAR logic circuit 14 controls the switches 1pl to 3pl, 1ph to 3ph, 1nl to 3nl, and 1nh to 3nh, to supply the voltage $V_{ref2}/2$ to the bottom plate of the positive side capacitor 10p, and supply the ground voltage to the bottom plate of the negative side capacitor 10n. In this state, the differential signals $V_4$p and $V_4$n are sampled and held.

In this way, when the differential voltages $V_4$p and $V_4$n are sampled and held, the voltage supplied to the bottom plate of the positive side capacitor 10p is different from the voltage supplied to the bottom plate of the negative side capacitor 10n.

Subsequently, in the fourth stage, the SAR logic circuit 14 supplies the ground voltage to the bottom plates of the positive side capacitor 10p and the negative side capacitor 10n. Although the voltage of the bottom plate of the positive side capacitor 10p drops by the voltage $V_{ref2}/2$, the amount of electric charge accumulated in the positive side capacitor 10p does not change. Therefore, the voltage of the top plate of the positive side capacitor 10p drops by the voltage $V_{ref2}/2$ by capacitive coupling. As a result, the voltage $V_4$p' represented by the formula (7a) below is obtained.

$$V_4p' = V_4/2 + Vcm - V_{ref2}/2 \quad (7a)$$

On the other hand, since the voltage of the bottom plate of the negative side capacitor 10n does not change, the voltage of the top plate of the negative side capacitor 10n does not change. As a result, the voltage $V_4$n' represented by the formula (7b) below is obtained.

$$V_4n' = V_4n = -V_4/2 + Vcm \quad (7b)$$

The voltage $V_4'$ (=$V_4 - V_{ref2}/2$) shown in FIG. 3 and represented by the above formula (5a) is obtained as a difference between the voltages $V_4$p' and $V_4$n'. Then the comparator 31 determines whether or not the condition 4' in the fourth stage: "$V_4'$>0", that is, "$V_4$p'>$V_4$n'", that is, "$V_4 - V_{ref2}/2$>0", is satisfied. When the condition 4' is satisfied, the SAR logic circuit 14 sets the fourth significant bit of the output digital signal Vout to "1". On the other hand, when the condition 4' is not satisfied, the SAR logic circuit 14 sets the fourth significant bit of the output digital signal Vout to "0".

When the condition 4' is satisfied, in the fifth stage in FIG. 5, the SAR logic circuit 14 changes only the voltage supplied to the bottom plate of the capacitor 13n from the ground voltage to the voltage $V_{ref2}/2$. As a result, the voltages $V_5$p and $V_5$n represented by the formulas (8a) and (8b) below are obtained by capacitive coupling.

$$V_5p = V_4/2 + Vcm - V_{ref2}/2 \quad (8a)$$

$$V_5n = -V_4/2 + Vcm + V_{ref2}/4 \quad (8b)$$

The voltage $V_5$ (=$V_4 - 3V_{ref2}/4$) shown in FIGS. 3 and 5 is obtained as a difference between the voltages $V_5$p and $V_5$n. The fifth significant bit of the output digital signal Vout is set according to whether or not the condition 5: "$V_5$>0", that is, "$V_5$p>$V_5$n", that is, "$V_4 - 3V_{ref2}/4$>0", is satisfied.

On the other hand, when the condition 4' is not satisfied, in the fifth stage, the SAR logic circuit 14 changes only the voltage supplied to the bottom plate of the capacitor 13p from the ground voltage to the voltage $V_{ref2}/2$. Thereafter, in the same manner as described above, the fifth significant bit of the output digital signal Vout is set.

In this way, in the fifth stage, the SAR logic circuit 14 switches the voltage supplied to the bottom plate of the capacitor 13p or the bottom plate of the capacitor 13n depending on whether or not the condition 4' is satisfied.

Further, in the sixth stage shown in FIG. 6, the SAR logic circuit 14 switches the voltage supplied to the bottom plate of the capacitor 12p or the bottom plate of the capacitor 12n depending on whether or not the condition 5 is satisfied. Thereby, the sixth bit of the output digital signal Vout is set.

In the manner as described above, it is possible to convert the input analog voltage Vin into the 6-bit output digital signal Vout.

In FIG. 5, power to change the voltage supplied to the bottom plate of each capacitor is indicated in parentheses. In the present embodiment, the voltage $V_{ref2}/2$ is used instead of the voltage $V_{ref2}$, thereby, reducing the power consumption.

Figure 7:
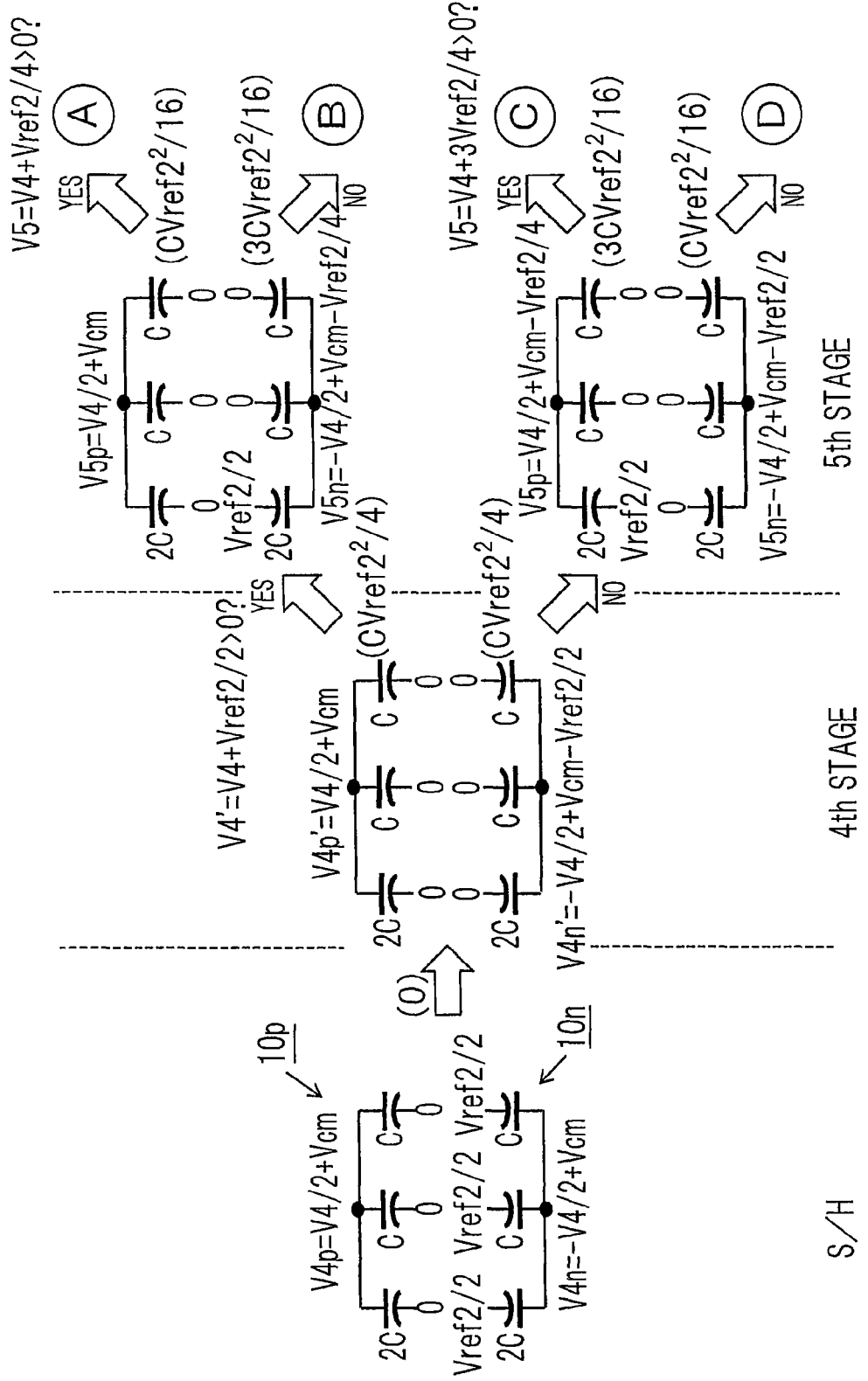
Figure 8:
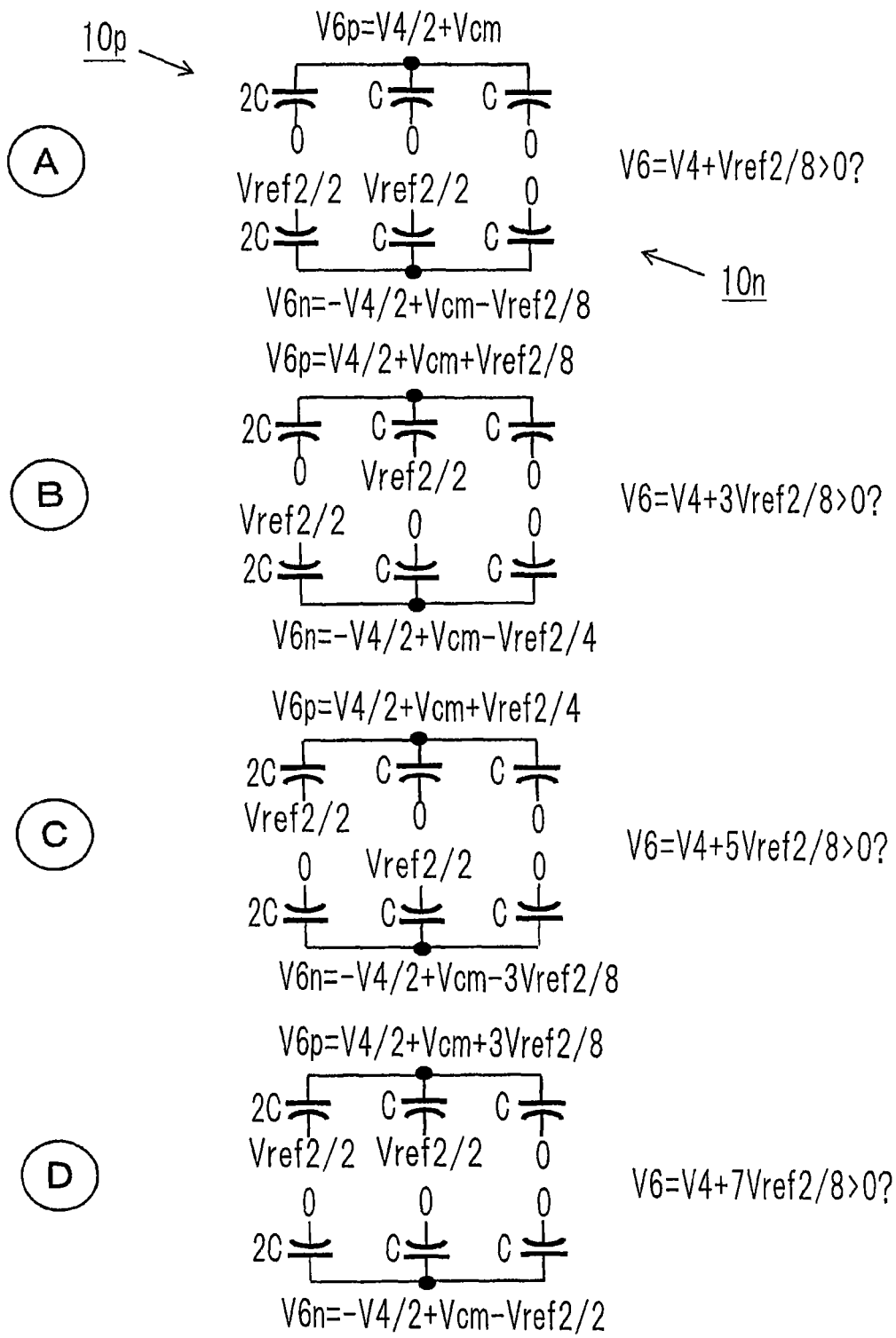

FIGS. 7 and 8 are diagrams for explaining the operation of the sub-ADC 13 and the SAR logic circuit 14 in FIG. 4, and show the operation when the condition 3: "$V_3>0$" is not satisfied in the process of the third stage in FIG. 3. In this case, the SAR logic circuit 14 controls the switches 1pl to 3pl, 1ph to 3ph, 1nl to 3nl, and 1nh to 3nh, to supply the ground voltage to the bottom plate of the positive side capacitor 10p, and supply the voltage $V_{ref2}/2$ to the bottom plate of the negative side capacitor 10n. In this state, the differential voltages $V_4p$ and $V_4n$ are sampled and held.

Although the detailed description is omitted, even when the condition 3 is not satisfied, the output digital signal Vout can be generated by performing the same processes as those shown in FIGS. 5 and 6.

As described above, in the first embodiment, when the sub-ADC 13 samples and holds the differential voltages $V_4p$ and $V_4n$ inputted from the amplifier 12, the voltage supplied to the bottom plate of each capacitor is set according to the determination result of the third stage which is the last process by the sub-ADC 11. Therefore, the sub-ADC 13 can immediately perform an effective process in the fourth stage. As a result, it is possible to improve the bit accuracy of the output digital signal Vout without increasing the circuit area. Furthermore, the voltage $V_{ref2}/2$, instead of the voltage $V_{ref2}$, is supplied to the bottom plate of each capacitor. Therefore, the ADC operates with low power consumption.

Second Embodiment

In a second embodiment described below, the ADC is used for an image sensor.

FIG. 9 is a block diagram showing a schematic configuration of an image sensor. The image sensor includes pixels 1, a low decoder 2, a CDS (Correlated Double Sampling) circuit 3, a column decoder 4, a PGA (amplification circuit) 5, and an ADC 6.

The pixels 1 are arranged in a matrix form. The number of pixels in the horizontal (column) direction is n (for example, 1720 columns) and the number of pixels in the vertical (row) direction is m (for example, 832 rows). Each pixel 1 generates an analog voltage Vpix according to the intensity of emitted light, The pixel 1 belonging to k-th column outputs the generated voltage Vpix to a signal line Vpix(k). In the description below, the code "Vpix(k)" and the like are used as a name of a signal line (or a terminal) as well as a voltage value of the signal line (or the terminal).

The pixel 1 generates a voltage Vpix when no light is emitted (hereinafter referred to as a "reset voltage Vres") and a voltage Vpix when light is emitted (hereinafter referred to as a "signal voltage Vsig") to perform a so-called correlated double sampling.

The low decoder 2 sequentially selects one of m rows arranged in the vertical direction. Thereby, the voltages Vpix generated by the n pixels 1 belonging to the selected row are read to the signal lines Vpix(k) respectively.

One CDS circuit 3 is arranged for pixels in one column, so that a total of n CDS circuits 3 are arranged. In other words, the CDS circuit 3(0) to the CDS circuit 3(n−1) are provided corresponding to the signal lines Vpix(0) to Vpix(n−1), respectively. The CDS circuits 3 samples and temporarily holds the reset voltage Vres and the signal voltage Vsig which are read from the pixel 1. By holding both the reset voltage Vres and the signal voltage Vsig and amplifying a difference between both voltages later, it is possible to suppress the effect of variation of the reset voltages Vres among the pixels 1.

The column decoder 4 sequentially selects one of n CDS circuits 3(0) to 3(n−1) and supplies the reset voltage Vres and the signal voltage Vsig held by the selected CDS circuit 3 to the PGA 5.

The PGA 5 is an amplifier that amplifies the difference between the reset voltage Vres and the signal voltage Vsig. The PGA 5 outputs a voltage corresponding to the signal voltage Vsig as differential voltages Voutp and Voutn.

FIG. 10 is a circuit diagram showing an example of an internal configuration of the pixel 1, Note that, the circuit diagram shown in FIG. 10 is only an example, and there may be various modified circuits.

The pixel 1 includes nMOS transistors Qn1 to Qn4 and a photodiode PD that performs photoelectric conversion. Regarding the transistor Qn1, the drain is connected to a power supply terminal Vdd25, a reset signal RESET is inputted into the gate, and the source is connected to a floating diffusion FD. Regarding the transistor Qn2, the drain is connected to the floating diffusion FD, a read signal READ is inputted into the gate, and the source is connected to the cathode of the photodiode PD. The anode of the photodiode PD is connected to the ground terminal.

Regarding the transistor Qn3, the drain is connected to the power supply terminal Vdd25, an address signal ADR is inputted into the gate, and the source is connected to the drain of the transistor Qn4. Regarding the transistor Qn4, the gate is connected to the floating diffusion FD and a voltage Vpix is generated from the source. The source of the transistor Qn4 is connected to the signal line Vpix(k) and the voltage Vpix is outputted to the signal line Vpix(k).

The power supply voltage supplied by the power supply terminal Vdd25 is, for example, 2.5 V. The address signal ADR, the reset signal RESET, and the read signal READ are generated by, for example, the low decoder 2.

The pixel 1 operates as described below to generate the reset voltage Vres and the signal voltage Vsig.

First, the reset signal RESET is set to high. Thereby, the transistor Qn1 is turned on and the floating diffusion FD is initialized to a predetermined voltage. Thereafter, the reset signal RESET is set to low. Then, the read signal READ is set to high while no light is emitted on the pixel 1 in order to generate the reset voltage Vres. Thereby, the transistor Qn2 is turned on. At this time, only a negligible current flows in the photodiode PD, and thus, the voltage of the floating diffusion FD hardly drops. Here, when the address signal ADR is set to high, the transistor Qn3 is turned on. Thereby, the reset voltage Vres corresponding to the voltage of the floating diffusion FD is outputted to the signal line Vpix(k).

To generate the signal voltage Vsig, an operation similar to the above operation is performed while light is emitted on the pixel 1. A current corresponding to the intensity (brightness) of the emitted light flows in the photodiode PD. The higher the intensity of the light is, the larger the current is. Therefore, as the intensity of the light is higher, the voltage of the floating diffusion FD becomes lower. The signal voltage Vsig corresponding to the voltage of the floating diffusion FD is outputted to the signal line Vpix(k).

FIG. 11 is a diagram schematically showing a relationship between the intensity of the light emitted on the pixel 1 (horizontal axis, any unit can be used) and the signal voltage Vsig generated by the pixel 1 (vertical axis, unit is "V"). As known from the above description, the higher the intensity of the light, the lower the signal voltage Vsig. In the description below, as an example, it is assumed that the reset voltage Vres is 1.5 V and the signal voltage Vsig when high intensity light is emitted is about 1.0 V.

As described above, when the light is emitted, a current flows in the photodiode PD, and thus, the reset voltage Vres is higher than the signal voltage Vsig, that is, Vres>Vsig. By taking this into account, an ADC 6 which is suitable for an image sensor will be described.

In FIG. 3, in the first stage, whether or not the condition 1: "Vin>0" is satisfied is determined. In the present embodiment in which the differential signals are used, whether or not "Vres>Vin" is satisfied is determined. However, in an image sensor, the magnitude correlation between the reset voltage Vres and the signal voltage Vsig is fixed as described above. Therefore, it is meaningless to determine whether or not the condition 1 is satisfied in the first stage.

Therefore, the descriptions of FIGS. 4 to 6 can be applied to the first to the third stages. In other words, in the present embodiment, the process of the second stage in FIG. 3 is performed in the first stage. In order to do that, as shown in FIG. 12, the first-stage sub-ADC 11 has the same circuit configuration as that of the sub-ADC 13 shown in FIG. 4. Each element in the sub-ADC 11 shown in FIG. 12 is denoted by a symbol generated by suffixing "'" to the symbol of each element in the sub-ADC 13 shown in FIG. 4.

The sub-ADC 11 samples and holds the reset voltage Vres at the top plate of the positive side capacitor 10p' and the signal voltage Vsig at the top plate of the negative side capacitor 10n'.

Since Vres>Vsig as described above, the SAR logic circuit 14 performs the operation shown in FIG. 5 instead of FIG. 7. Specifically, the sub-ADC 11 samples and holds the reset voltage Vres and the signal voltage Vsig in a state in which the voltage $V_{refl}/2$ is supplied to the bottom plate of the positive side capacitor 10p of the sub-ADC 11 and the ground voltage is supplied to the bottom plate of the negative side capacitor 10n of the sub-ADC 11.

Thereafter, the switches 21p' and 21n' are turned off and the ground voltage is supplied to the bottom plates of the capacitors 10p and 10n (in the same manner as in the fourth stage in FIG. 5). Thereby, as the first stage, the sub-ADC 11 determines whether or not the condition 2 shown in the second stage in FIG. 3: "Vres−Vsig−$V_{refl}/2$>0" is satisfied.

In this way, the determination of the condition 1: "Vres−Vsig>0" can be omitted. Thereafter, the sub-ADC 11 may perform the same processes as those in FIGS. 5 and 6.

As described above, in the second embodiment, by using the fact that the reset voltage Vres is higher than the signal voltage Vsig, when these voltages are sampled and held by the capacitors, the voltages supplied to the bottom plates are set asymmetrically in the image sensor. Therefore, it is possible to improve efficiency of the A-D conversion process in the first-stage sub-ADC 11, reduce the circuit area of the ADC 6, and reduce the power consumption.

Third Embodiment

In the third embodiment described above, Vres>Vsig is assumed. However, due to noise or the like, an offset voltage Is subtracted from Vres or an offset voltage is added to Vsig, so that the magnitude correlation between the reset voltage Vres and the signal voltage Vsig may be reversed and Vres may be smaller than Vsig. The magnitude correlation between Vres and Vsig may be reversed by an offset voltage between differential signals in an analog circuit while the signals are transmitted though the CDS circuit 3 and PGA 5 to the ADC 6. In the present embodiment, the offset between differential signals is cancelled in the ADC 6.

For example, when the reset voltage Vres is actually 1.3 V by the noise and the like even though the reset voltage Vres is assumed to be 1.5 V, the A-D conversion as described above may be performed after adding an offset voltage Vofs=1.5V−1.3V=0.2V to the reset voltage Vres=1.3 V. In other words, in the first stage, whether or not "(Vres+Vofs)−Vsig−$V_{refl}/2$>0" is satisfied may be determined instead of determining whether or not the condition 2: "Vres−Vsig−$V_{refl}/2$>0" is satisfied.

In order to do this, when the reset voltage Vres and the signal voltage Vsig are sampled and held, the SAR logic circuit 14 may control the voltages supplied to the bottom plates according to the magnitude of the offset voltage Vofs.

FIG. 13 is a diagram showing a relationship between the voltages supplied to the bottom plates of the capacitors 10p' (11p' to 13p') and 10n' (11n' to 13n') in FIG. 12 and the offset voltage Vofs when the sample and hold is performed.

FIG. 14 is a diagram for explaining a case of setting 0, in which the offset voltage Vofs is set to 0 V. As shown in FIG. 14, in the setting 0, the reset voltage Vres and the signal voltage Vsig are sampled and held while the voltage $V_{refl}/2$ is supplied to the bottom plates of the capacitors 11p' to 13p' and the ground voltage is supplied to the bottom plates of the capacitors 11n' to 13n' by the control of the SAR logic circuit 14. Thereafter, the ground voltage is supplied to the bottom plates of the capacitors 10p' and 10n'. Thereby, the voltage of the top plate of the capacitor 10p' drops by the voltage $V_{refl}/2$. As a result, whether "(Vres+0)−Vsig−$V_{refl}/2$>0" is satisfied or not is determined as the condition 2. In this way, it is possible to set the offset voltage Vofs to 0 V.

Figure 15:
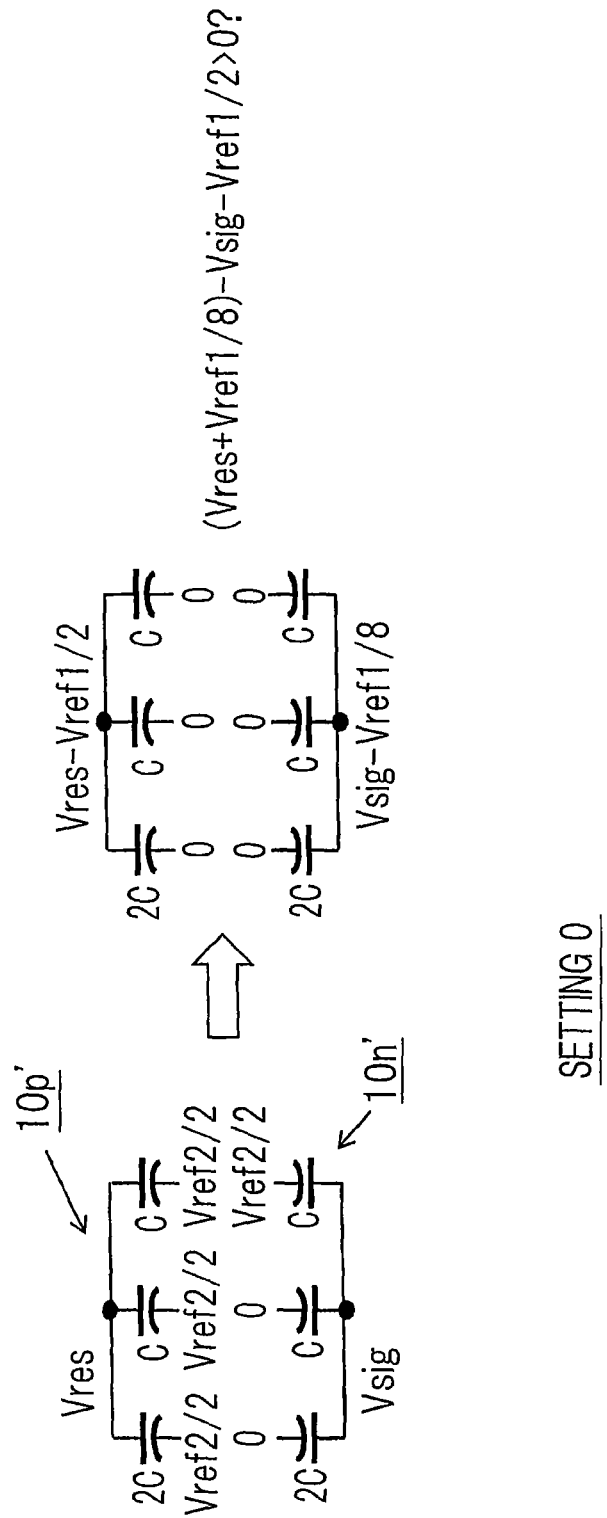
FIG. 15 is a diagram for explaining a case of setting 1.

FIG. 15 is a diagram for explaining a case of setting 1, in which the offset voltage Vofs is set to $V_{refl}/8$. As shown in FIG. 15, in the setting 1, the reset voltage Vres and the signal voltage Vsig are sampled and held while the voltage $V_{refl}/2$ is supplied to the bottom plates of the capacitors 11p' to 13p', the voltage $V_{refl}/2$ is supplied to the bottom plate of the capacitor 11n', and the ground voltage is supplied to the bottom plates of the capacitors 12n' and 13n' by the control of the SAR logic circuit 14. Thereafter, the ground voltage is supplied to the bottom plates of the capacitors 10p' and 10n'. Thereby, the voltage of the top plate of the capacitor 10p' drops by the voltage $V_{refl}/2$ and the voltage of the top plate of the capacitor 10n' drops by the voltage $V_{refl}/8$. As a result, whether "(Vres+$V_{refl}/8$)−Vsig−$V_{refl}/2$>0" is satisfied or not is determined as the condition 2. In this way, it is possible to set the offset voltage Vofs to $V_{refl}/8$.

Although the description is omitted, as indicated by the settings 0 to 8, the offset voltage Vofs can be adjusted to 8 steps from 0 to $V_{refl}$ by controlling the voltage supplied to the bottom plates. In the above description, an example is shown in which three capacitors are provided on each of the positive and the negative sides, so that the offset voltage Vofs can be adjusted to 8 steps. However, the offset voltage Vofs can be adjusted more finely by increasing the number of capacitors.

The voltage supply manner shown in FIG. 13 is only an example. For example, in the setting 2, the voltage $V_{refl}/2$ may be supplied to the capacitor 13n' with a capacitance of 2C instead of supplying the voltage $V_{refl}/2$ to the capacitors 11n' and 12n' with a capacitance of C. It is possible to set the offset voltage Vofs to a negative value.

It has been described that the sub-ADC 11 performs an offset cancel function. However, more generally, the post-stage sub-ADC 13 can also perform the same offset cancel function. Thereby, for example, even when there is an offset between the positive output and the negative output of the amplifier 12, the offset can be cancelled.

In this way, in the third embodiment, when the reset voltage Vres and the signal voltage Vsig are sampled and held, the voltages supplied to the bottom plates of the capacitors are controlled according to the reset voltage Vres. Thereby, the offset of the reset voltage Vres can be cancelled.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor integrated circuit configured to convert a difference between a first analog voltage and a second analog voltage into a digital signal, the semiconductor integrated circuit comprising:
   m (m is an integer greater than or equal to 2) first capacitors, each of which comprises a first electrode and a second electrode, the first electrodes being connected to each other;
   m second capacitors, each of which comprises a third electrode and a fourth electrode, the third electrodes being connected to each other;
   a comparator configured to compare a voltage of the first electrode and a voltage of the third electrode; and
   a logic circuit configured to generate the digital signal based on a comparison result of the comparator,
   wherein the first analog voltage is inputted into the first electrode,
   the second analog voltage is inputted into the third electrode, and
   one of a ground voltage and substantially ½ of a voltage of an input voltage range of the semiconductor integrated circuit is inputted into each second electrode and each fourth electrode.

2. The circuit of claim 1, wherein
   only two switches are connected to each second electrode and each fourth electrode,
   the ground voltage is supplied through one switch, and
   the substantially ½ of the voltage of the input voltage range of the semiconductor integrated circuit is supplied through the other switch.

3. The circuit of claim 1, wherein
   a capacitance of a first-stage capacitor among the m first capacitors is a reference capacitance "C",
   a capacitance of a first-stage capacitor among the m second capacitors is the reference capacitance "C",
   a capacitance of k-th stage capacitor among the m first capacitors is $2^{k-2}C$, and
   a capacitance of k-th stage capacitor among the m second capacitors is $2^{k-2}C$.

4. The circuit of claim 1, wherein the logic circuit is configured to control the voltage supplied to the second electrode and the fourth electrode based on the comparison result of the comparator.

5. The circuit of claim 1, wherein
   the first analog voltage is inputted to the first electrode through a first switch, and
   the second analog voltage is inputted to the third electrode through a second switch.

6. A semiconductor integrated circuit configured to convert a difference between a first analog voltage and a second analog voltage into a digital signal, the semiconductor integrated circuit comprising:
   m (m is an integer greater than or equal to 2) first capacitors, each of which comprises a first electrode and a second electrode, the first electrodes being connected to each other;
   m second capacitors, each of which comprises a third electrode and a fourth electrode, the third electrodes being connected to each other;
   a comparator configured to compare a voltage of the first electrode and a voltage of the third electrode; and
   a logic circuit configured to generate the digital signal based on a comparison result of the comparator,
   wherein the first analog voltage is inputted into the first electrode through a first switch in a state in which one of a ground voltage and a reference voltage higher than the ground voltage is supplied to the second electrode, and
   the second analog voltage is inputted into the third electrode through a second switch in a state in which the other one of the ground voltage and the reference voltage is supplied to the fourth electrode.

7. The circuit of claim 6, wherein
   when the second analog voltage is lower than the first analog voltage,
      the first analog voltage is inputted into the first electrode in a state in which the reference voltage is supplied to the second electrode, and
      the second analog voltage is inputted into the third electrode in a state in which the ground voltage is supplied to the fourth electrode, and
   when the second analog voltage is higher than the first analog voltage,
      the first analog voltage is inputted into the first electrode in a state in which the ground voltage is supplied to the second electrode, and
      the second analog voltage is inputted into the third electrode in a state in which the reference voltage is supplied to the fourth electrode.

8. The circuit of claim 6, wherein
   a capacitance of a first-stage capacitor among the m first capacitors is a reference capacitance "C",
   a capacitance of a first-stage capacitor among the m second capacitors is the reference capacitance "C",
   a capacitance of k-th stage capacitor among the m first capacitors is $2^{k-2}C$, and
   a capacitance of k-th stage capacitor among the m second capacitors is $2^{k-2}C$.

9. The circuit of claim 6, wherein the logic circuit is configured to control the voltage supplied to the second electrode and the fourth electrode based on the comparison result of the comparator.

10. The circuit of claim 6, wherein
the first switch is turned off after the first analog voltage is inputted into the first electrode, and the second switch is turned off after the second analog voltage is inputted into the third electrode, and
after the first switch and the second switch are turned off, the comparator is configured to compare the voltage of the first electrode and the voltage of the third electrode in a state in which the ground voltage is supplied to the second electrode and the fourth electrode.

11. The circuit of claim 6, wherein the reference voltage is substantially ½ of a voltage of an input voltage range of the semiconductor integrated circuit.

12. An image sensor comprising:
a pixel; and
an A-D converter configured to convert a difference between a reset voltage and a signal voltage, the reset voltage being outputted from the pixel when light is not emitted on the pixel, the signal voltage being outputted from the pixel when light is emitted on the pixel,
wherein the A-D converter comprises:
m (m is an integer greater than or equal to 2) first capacitors, each of which comprises a first electrode and a second electrode, the first electrodes being connected to each other;
m second capacitors, each of which comprises a third electrode and a fourth electrode, the third electrodes being connected to each other;
a comparator configured to compare a voltage of the first electrode and a voltage of the third electrode; and
a logic circuit configured to generate the digital signal based on a comparison result of the comparator,
wherein the reset voltage is inputted into the first electrode through a first switch in a state in which one of a ground voltage and a reference voltage is, according to the reset voltage, supplied to the second electrode,
the signal voltage is inputted into the third electrode through a second switch in a state in which one of the ground voltage and the reference voltage is, according to the reset voltage, supplied to the fourth electrode, and
thereafter, the first switch and the second switch are turned off, and the comparator is configured to compare the voltage of the first electrode and the voltage of the third electrode in a state in which the ground voltage is supplied to the second electrode and the fourth electrode.

13. The image sensor of claim 12, wherein
when the reset voltage is a first voltage,
the reset voltage is inputted into the first electrode through the first switch in a state in which the reference voltage is supplied to each second electrode, and
the signal voltage is inputted into the third electrode through the second switch in a state in which the ground voltage is supplied to each fourth electrode.

14. The image sensor of claim 13, wherein
when the reset voltage is lower than the first voltage,
the reset voltage is inputted into the first electrode through the first switch in a state in which the reference voltage is supplied to each second electrode, and
the signal voltage is inputted into the third electrode through the second switch in a state in which the reference voltage is supplied to at least one fourth electrode.

15. The image sensor of claim 13, wherein
when the reset voltage is lower than the first voltage,
the reset voltage is inputted into the first electrode through the first switch in a state in which the ground voltage is supplied to at least one second electrode, and
the signal voltage is inputted into the third electrode through the second switch in a state in which the reference voltage is supplied to each fourth electrode.

16. The image sensor of claim 13, wherein the first voltage is a maximum value of the signal voltage.

17. The image sensor of claim 12, wherein
a capacitance of a first-stage capacitor among the m first capacitors is a reference capacitance "Cu",
a capacitance of a first-stage capacitor among the m second capacitors is the reference capacitance "C",
a capacitance of k-th stage capacitor among the m first capacitors is $2^{k-2}C$, and
a capacitance of k-th stage capacitor among the m second capacitors is $2^{k-2}C$.

18. The image sensor of claim 12, wherein the logic circuit is configured to control the voltage supplied to the second electrode and the fourth electrode based on the comparison result of the comparator.

19. The image sensor of claim 12, wherein the reference voltage is substantially ½ of a voltage of an input voltage range of the A-D converter.

* * * * *

UNITED STATES PATENT AND TRADEMARK OFFICE
CERTIFICATE OF CORRECTION

| | | |
|---|---|---|
| PATENT NO. | : 8,717,219 B2 | Page 1 of 1 |
| APPLICATION NO. | : 13/780685 | |
| DATED | : May 6, 2014 | |
| INVENTOR(S) | : Jun Deguchi | |

It is certified that error appears in the above-identified patent and that said Letters Patent is hereby corrected as shown below:

On the title page, Item (30), the Foreign Application Priority Data has been omitted. Item (30) should read:

-- (30) Foreign Application Priority Data

Sep. 10, 2012 (JP) .................................... 2012-198743 --

Signed and Sealed this
Twenty-ninth Day of July, 2014

Michelle K. Lee
*Deputy Director of the United States Patent and Trademark Office*